(12) United States Patent
Mahmoudi et al.

(10) Patent No.: US 9,331,670 B1
(45) Date of Patent: May 3, 2016

(54) GAMMA BOOSTING UNIT (GBU) FOR HYBRID LOAD AND SOURCE PULL

(71) Applicant: FocusMW IP. Inc., Dollard-des-Ormeaux (CA)

(72) Inventors: Reza Mahmoudi, Eindhoven (NL); Foad Arfaei Malekzadeh, Kitchener (CA); Jacobus A. J. Essing, Eindhoven (NL)

( * ) Notice: Subject to any disclaimer, the term of this patent is extended or adjusted under 35 U.S.C. 154(b) by 231 days.

(21) Appl. No.: 13/893,610

(22) Filed: Aug. 7, 2013

(51) Int. Cl.
*H03J 1/00* (2006.01)
(52) U.S. Cl.
CPC .......................................... *H03J 1/00* (2013.01)
(58) Field of Classification Search
CPC .......................................................... H03J 1/00
USPC ............................................................. 333/32
See application file for complete search history.

(56) References Cited

U.S. PATENT DOCUMENTS 5,977,826 A * 11/1999 Behan et al. .................. 330/151
2004/0207426 A1* 10/2004 Tsironis ........................ 324/764

OTHER PUBLICATIONS

F.M. Ghannouchi, M.S. Hashmi, "Load-Pull Techniques with Applications to Power Amplifier Design", Chapter 2 Springer Series in Advanced Microelectronics 32, DOI 10.1007/978-94-007-4461-5_2, © Springer Science+Business Media Dordrecht 2013.
Active load pull: http://www.microwaves101.com/encyclopedia/loadpull.cfm.
F.M. Ghannouchi, M.S. Hashmi, "Load-Pull Techniques with Applications to Power Amplifier Design", Chapter 2, Passive Load Pull Systems, Springer Series in Advanced Microelectronics 32, DOI 10.1007/978-94-007-4461-5_2, © Springer Science+Business Media Dordrecht 2013 Passive tuners,.

* cited by examiner

*Primary Examiner* — Stephen E Jones
*Assistant Examiner* — Scott S Outten

(57) ABSTRACT

A hybrid load pull tuner system uses a combination of a passive and active tuner system. A closed loop system means that the system is independent of the available power of the device under test (DUT). The proposed hybrid system is formed around a closed loop Gamma Boosting Unit (GBU) consisting of two back to back broadband directional couplers, broadband variable time-delay, broadband variable phase-shifter and a broadband microwave amplifier, all inserted in the coupled path of the couplers; the GBU is connected in cascade with a passive tuner and boosts its reflection factor; for this the amplifier must have enough linear power and gain to match the difference between the power reflected back to the DUT by the passive tuner and the desired total reflected power to reach the expected Gamma, considering coupling loss and insertion loss of the test fixture.

9 Claims, 14 Drawing Sheets

Proposed hybrid load-pull system with the Gamma Boosting Unit (GBU)

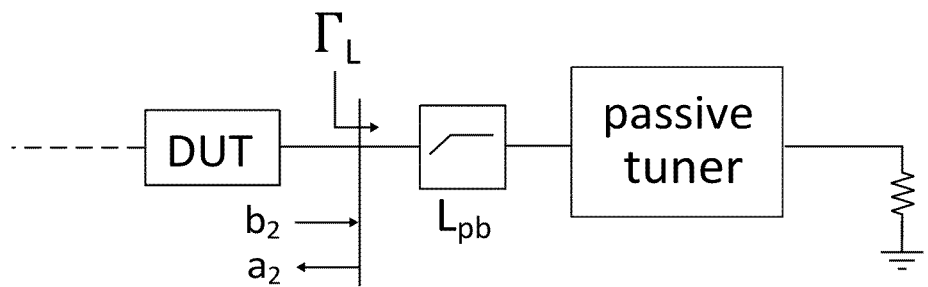
Figure 1 prior art: passive load-pull system

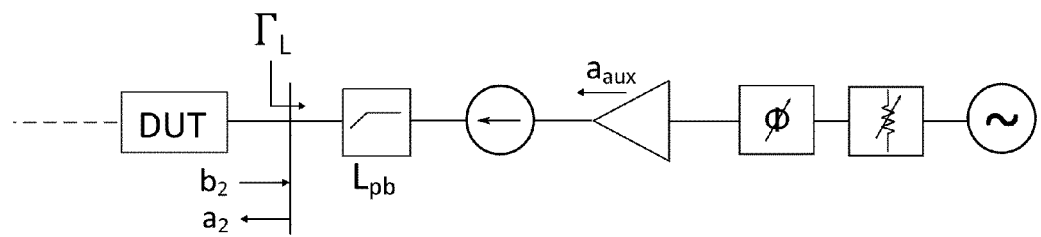
Figure 2 prior art: active load-pull system, open loop

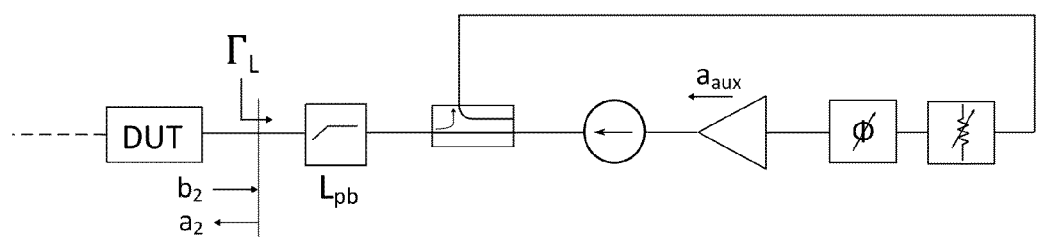
Figure 3 prior art: active load-pull system, closed loop

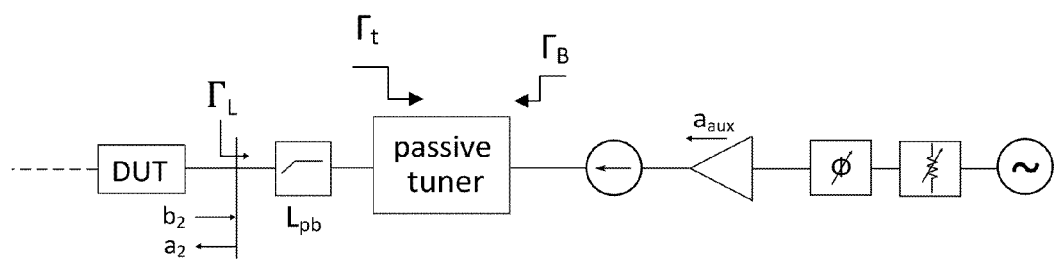
Figure 4 prior art: hybrid load-pull system, open loop

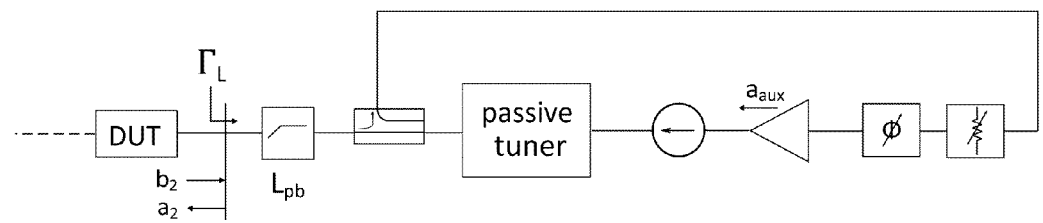
Figure 5 prior art: hybrid load-pull system, closed loop

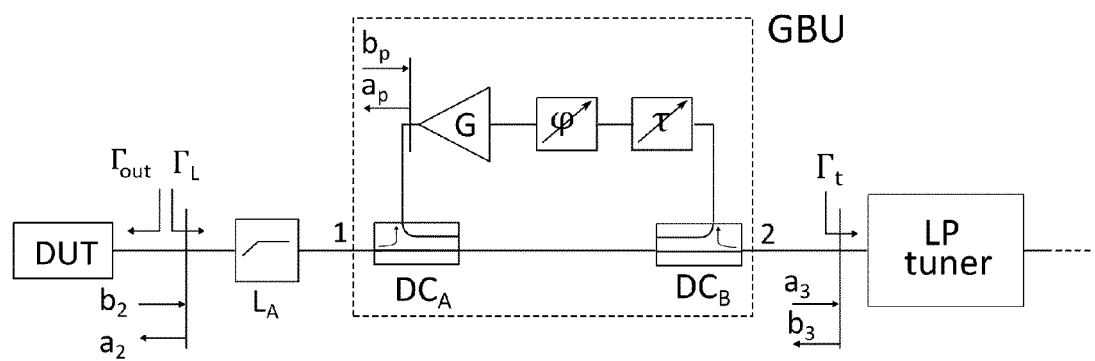
Figure 6 Proposed hybrid load-pull system with the Gamma Boosting Unit (GBU)

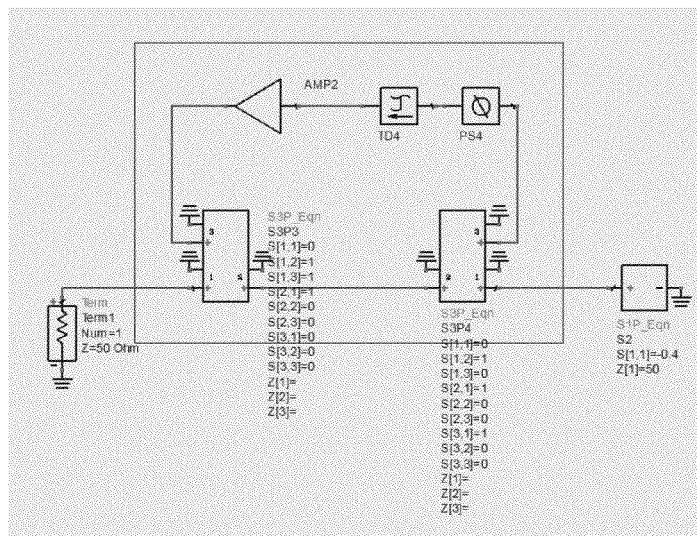
Figure 7 Test bench in simulation environment used to show GBU's frequency selectivity

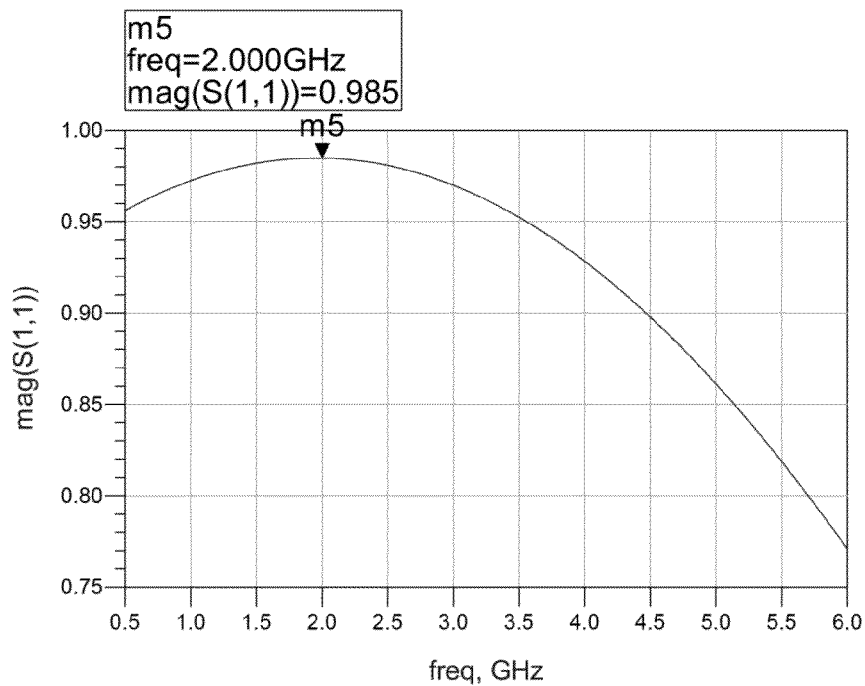
Figure 8 Fundamental only (f0=2GHz) frequency selectivity at $\Delta\phi = 38°$, $\Delta\tau=54$ps.

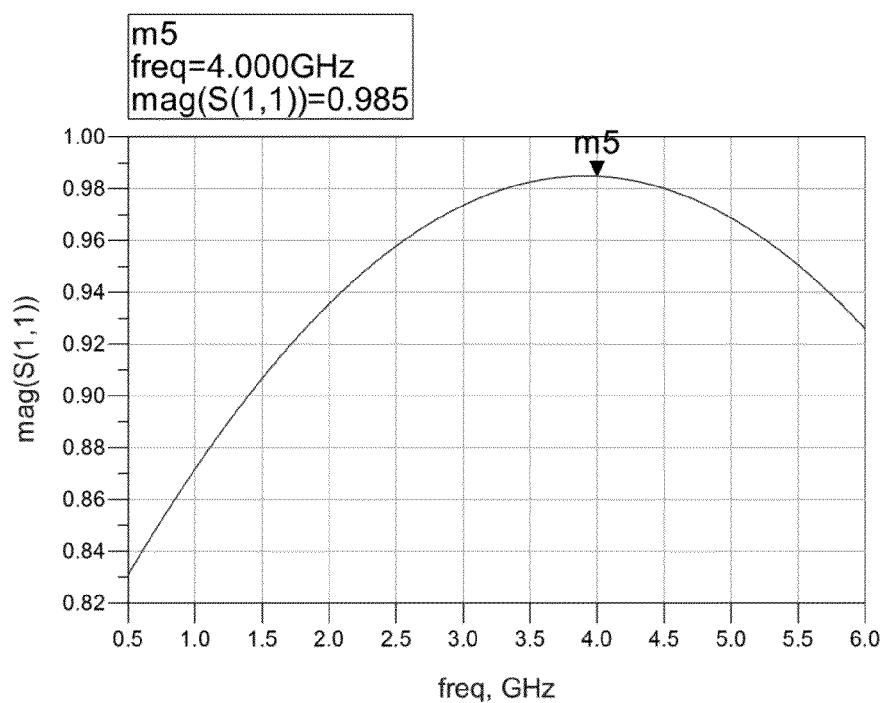
Figure 9 Fundamental only (f0=4GHz) frequency selectivity at $\Delta\phi$ =76°, $\Delta\tau$=54ps.

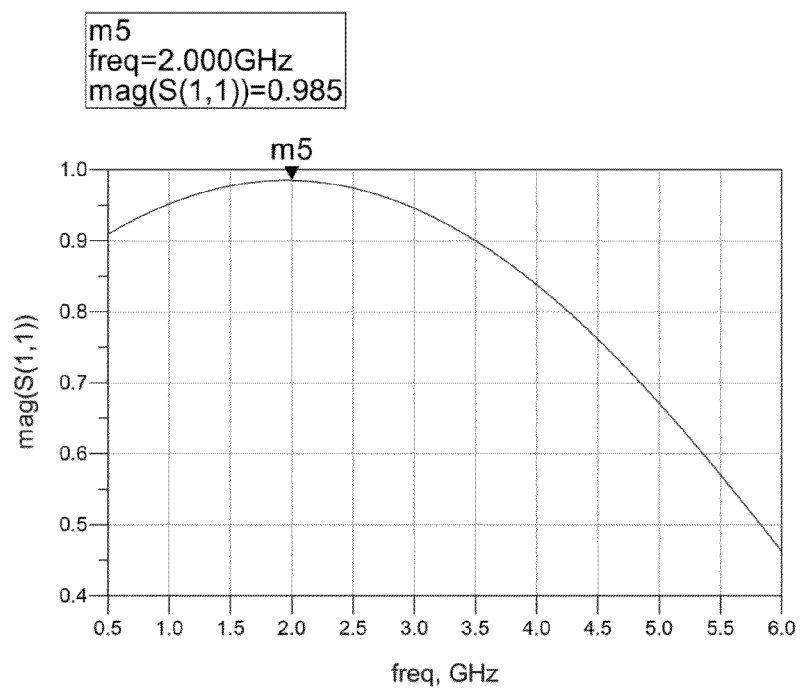
Figure 10 Fundamental only (f0=2GHz) frequency selectivity at $\Delta\phi = 62°$, $\Delta\tau = 88$ps.

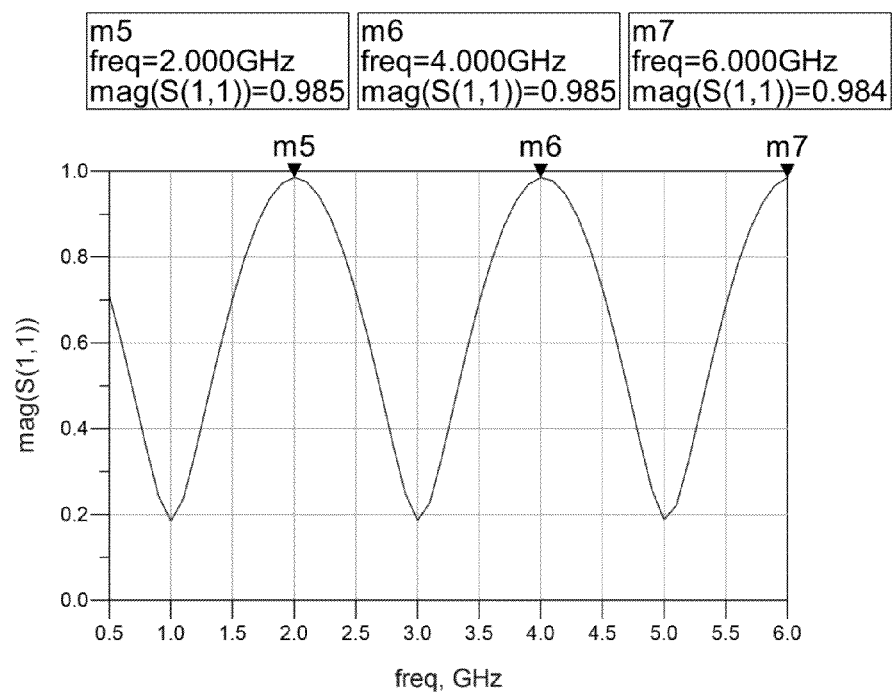
Figure 11 Fundamental (f0=2GHz) and harmonic frequency selectivity at $\Delta\phi = 0°$, $\Delta\tau = 498$ps.

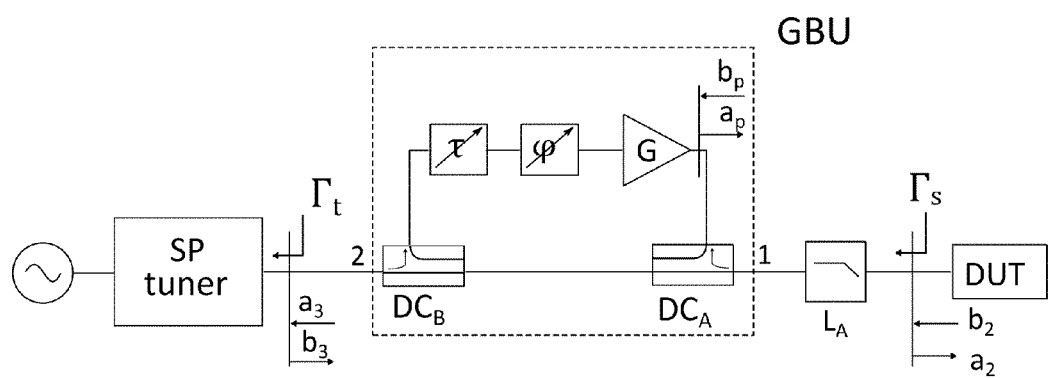
Figure 12 Proposed hybrid source-pull system with the Gamma Boosting Unit (GBU)

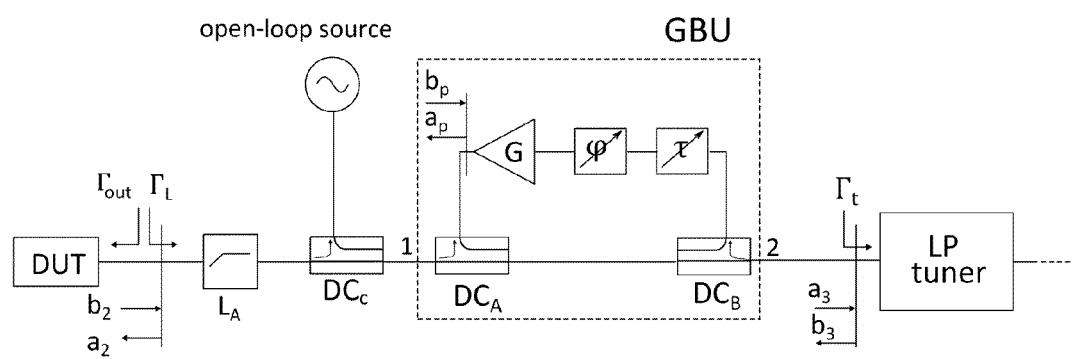
Figure 13 GBU combined with passive tuner and an open-loop active injecting source.

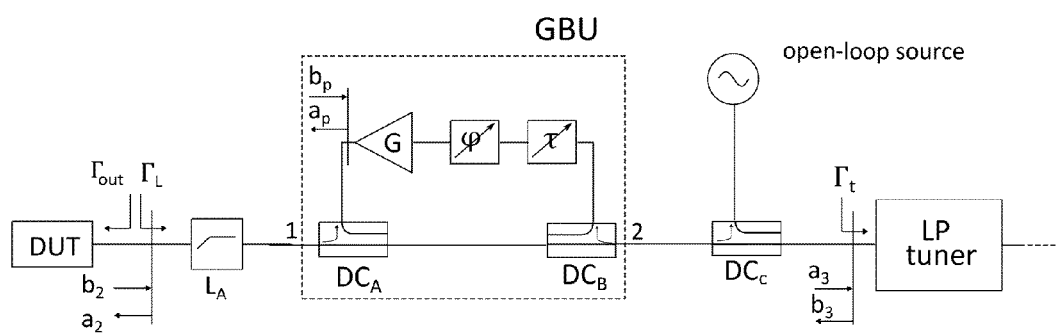
Figure 14 GBU combined with passive tuner and an open-loop active injecting source. Open-loop source is located in between GBU and passive tuner

US 9,331,670 B1

GAMMA BOOSTING UNIT (GBU) FOR HYBRID LOAD AND SOURCE PULL

PRIORITY CLAIM

This application claims priority on provisional application 61/646,400 filed on May 14, 2012.

CROSS-REFERENCE TO RELATED ARTICLES

[1] F. M. Ghannouchi, M. S. Hashmi, Load-Pull Techniques with Applications to Power Amplifier Design, Springer Series in Advanced Microelectronics 32 DOI 10.1007/978-94-007-4461-5_2, © Springer Science+ Business Media Dordrecht 2013
[2] Active load pull: http://www.microwaves101.com/encyclopedia/loadpull.cfm
[3] Passive tuners, see [1]

BACKGROUND OF THE INVENTION

Prior Art

Modern design of high power microwave amplifiers and oscillators, used in various communication systems, requires accurate knowledge of the active device's (microwave transistor's) characteristics. A popular method for testing and characterizing such microwave components (transistors) in the non-linear region of operation is "load pull". Load pull is a measurement technique employing microwave tuners and other microwave test equipment. The microwave tuners are used in order to manipulate the fundamental and harmonic impedance conditions under which the Device Under Test (DUT, or transistor) operates.

There are essentially two methods that allow generating and manipulating fundamental and harmonic impedances presented to the DUT at microwave frequencies:
   A. Using electromechanical or passive electronic tuners, leading to "passive load pull" (FIG. 1), [1] and
   B. Active tuners, leading to "active load pull" (FIG. 2), [2].

Electro-mechanical slide screw tuners have a number of advantages like long-term stability, higher handling of microwave power, much easier operation and lower cost. Such tuners use adjustable mechanical obstacles (probes) in the transmission media of the tuners in order to reflect part of the power coming out of the DUT and create "real" fundamental and harmonic impedances presented to the DUT (device under test) [3].

Active tuners are in fact microwave circuits, which include at least one microwave amplifier, that sample signals coming out of the DUT and return them to the DUT after amplifying it and modifying its amplitude and phase using variable phase-shifters and attenuators, creating "virtual" fundamental and harmonic impedances presented to the DUT. Circulators are used to prevent damaging the microwave amplifier from returned power (FIG. 2).

In both cases, A and B, it is possible to characterize the DUT properly. The main difference between an "active" and a "passive" tuner system is the fact that an active system may generate reflection factors, which are equal to or greater than 1.0 (a reflection factor of 1.0 corresponds to a real part of the microwave impedance of 0Ω, reflection factor values >1.0 correspond to real parts of the microwave impedances of <0Ω); passive tuners are limited in terms of reflection factor to values below 1, typically below 0.95 (corresponding to an impedance of 1.3Ω). Considering unavoidable insertion loss between the DUT and the test port of a load pull tuner in a realistic test set-up, this means that a passive tuner can only allow testing of DUT's with internal impedances above roughly 2Ω. Active tuner systems therefore allow one to test DUT's with lower internal impedance than passive systems do, since the reflection factor can reach 1.0; active systems allow compensating for insertion loss between the DUT and the passive tuners. DUT's with impedances below 2Ω can therefore not be tested using passive tuner systems alone, whereas active systems allow, in principle, this to be done.

Generating a large reflection coefficient with active tuner systems in combination with a high output power at the DUT reference plane requires an extremely high level of injected power, since available power amplifiers have a typical output impedance of 50Ω, whereas the DUT has <2Ω; this creates a large mismatch situation, which requires large power from the power amplifier. In order to reduce the stress on the microwave amplifier, passive and active tuners are combined in a hybrid tuner system (FIGS. 4 and 5). In such hybrid systems the energy flow towards the reference plane of the DUT output port (b2, a2) is now composed of the active injected power and the reflected power from the passive tuner.

In such hybrid system, the passive tuner is located between the DUT's output and the microwave amplifier. A part of the available power generated by the microwave amplifier ($a_{aux}$) (FIGS. 4, 5) will therefore, after traversing the isolator, be reflected back at the output port of the passive tuner (reflection factor=$\Gamma_B$) and will be absorbed by the isolator. At a very high tuner reflection factor ($\Gamma_t$) setting, also $\Gamma_B$ is very high, which results in a large amount of $a_{aux}$ reflected back and not adding to the reflected wave $a_2$ at the DUT's output. Therefore an optimum setting of $\Gamma_t$ results, which maximizes the reflection coefficient at the DUT's output $\Gamma_L$ with a minimum amount of active injected power $a_{aux}$. An advanced algorithm is required for determination of this optimum $\Gamma_t$ setting.

In active and hybrid tuner systems, one can distinguish two types for controlling the reflection coefficient:
   a. Open loop (FIGS. 2 and 4), and
   b. Closed loop (FIGS. 3 and 5).

The open loop type requires a control algorithm to synthesize a fixed reflection coefficient $\Gamma_L$ at the DUT's output. During a sweep the $b_2$ value changes; therefore the algorithm needs to synthesize the reflected a2 wave for each specific $b_2$ value such that the $\Gamma_L$ remains fixed.

The closed active loop type of system uses a feedback loop to synthesize a fixed reflection coefficient $\Gamma_L$ at the DUT's output during sweep. The reflection coefficient $\Gamma_L$ becomes in this case independent of the changing available power of the DUT. The feedback loop consists of directional coupler's coupled path, variable phase-shifter and attenuator, microwave amplifier, circulator and directional coupler's through path. As the operation of the closed loop type relies on a constant loop gain, both in amplitude and phase, a highly linear microwave amplifier with negligible AM/PM conversion behavior is required when the power wave exiting from the DUT ($b_2$) increases in amplitude.

Closed loop circuits may oscillate, when the loop gain is >1 and the phase 360 degrees; to prevent oscillations of the closed loop type at frequencies other than the operation frequency, additional selective filters can be required in the loop. This reduces the loop gain outside the frequency band of interest and prevents spontaneous spurious oscillations.

For both active loop types (open and closed) additional signal paths are required for each harmonic reflection coefficient to be synthesized. Each of the paths encompasses a microwave amplifier, circulator and variable phase-shifter and attenuator. For the closed loop type also an additional selective filter can be required for each path.

DESCRIPTION OF THE DRAWINGS

The disclosed invention will be better understood when viewed together with the enclosed pictures, as follows:

FIG. 1 depicts prior art, a typical passive load-pull system

FIG. 2 depicts prior art, a typical active load-pull system, open loop

FIG. 3 depicts prior art, a typical active load-pull system, closed loop

FIG. 4 depicts prior art, a hybrid load-pull system, open loop

FIG. 5 depicts prior art, a hybrid load-pull system, closed loop

FIG. 6 depicts a hybrid load-pull system with the Gamma Boosting Unit (GBU)

FIG. 7 depicts a test bench in simulation environment used to show GBU's frequency selectivity FIG. 8 depicts Fundamental only (f0=2 GHz) frequency selectivity at $\Delta\phi=38°$, $\Delta\tau=54$ ps FIG. 9 depicts Fundamental only (f0=4 GHz) frequency selectivity at $\Delta\phi=76°$, $\Delta\tau=54$ ps.

FIG. 10 depicts Fundamental only (f0=2 GHz) frequency selectivity at $\Delta\phi=62°$, $\Delta\tau=88$ ps. More narrow lobe as in FIG. 8

FIG. 11 depicts Fundamental (f0=2 GHz) and harmonic frequency selectivity at $\Delta\phi=0°$, $\Delta\tau=498$ ps. This allows for synthesizing multiple harmonic reflection coefficients at f=2, 4, 6 GHz FIG. 12 depicts hybrid source-pull system with the Gamma Boosting Unit (GBU)

FIG. 13 depicts GBU combined with passive tuner and an open-loop active injecting source. Open-loop source is located in between DUT's output and GBU FIG. 14 depicts GBU combined with passive tuner and an open-loop active injecting source. Open-loop source is located in between GBU and passive tuner

DETAILED DESCRIPTION OF THE INVENTION

The proposed tuner system is a hybrid system, a combination of a passive and active tuner system. The invention is a closed loop system, which means the system is independent of the available power of the device under test (DUT).

The proposed hybrid system is formed around a Gamma Boosting Unit (GBU) and is shown in FIG. 6. The GBU consists of two broadband directional couplers DCA and DCB, a broadband variable time-delay, broadband variable phase-shifter and a broadband microwave amplifier which has an available gain of G. The losses of the probe and cable are indicated as LA.

Assuming the components of the system (FIG. 6) (except "LP tuner") are matched to 50Ω, the principle of the operation of the proposed system is as follows:

The outgoing power wave from the DUT's output, b2, flows through the through paths of DCA and DCB towards the passive tuner. Here some part of the wave will be reflected at the input-plane of the tuner to generate a new power wave, b3. This new power wave can be expressed as $b_3=a_3*\Gamma_t$, in which $\Gamma_t$ is the tuner reflection coefficient.

The power wave b3 travels back towards the DUT output via two paths:

a) One part via the through paths of DCB and DCA, "the passive path".

b) The other part via the coupled paths of DCB and DCA and where the phase-shift and time-delay of this path can be manipulated, if desirable. Afterwards it's amplified by the microwave amplifier. This is "the active path".

The reflection coefficient $\Gamma_L$ at the DUT output can be expressed as:

$$\Gamma_L = \frac{a_2}{b_2} = L_A^2 S_{21,GBU} S_{12,GBU} \Gamma_t \qquad (1)$$

With:

$$S_{21,GBU}=DC_{A,thr}DC_{B,thr}$$

$$S_{12,GBU}=DC_{A,thr}DC_{B,thr}+DC_{A,cpl}DC_{B,cpl}Ge^{-j(\omega\Delta\tau+\Delta\phi)} \qquad (2)$$

where $\Delta\tau$ and $\Delta\phi$ represent respectively the relative time-delay and phase-shift between the passive and the active path. $DC_{X,thr}$ and $DC_{X,cpl}$ represent respectively the through and the coupled path of the specific directional couplers.

$\Gamma_t$ is enhanced (boosted) by $S_{21,GBU}*S_{12,GBU}$, which means that the losses $L_A$ can be compensated if $|S_{21,GBU}*S_{12,GBU}|=|1/L_A|$, which results in $\Gamma_L=\Gamma_t$. A reflection coefficient at the DUT's output larger than $\Gamma_t$ is feasible if $|S_{21,GBU}*S_{12,GBU}|>|1/L_A|$.

$\Gamma_L$ is a direct function of $\Gamma_t$, i.e. by adjusting $\Gamma_t$, the magnitude and phase of $\Gamma_L$ can directly be controlled. Therefore no variable attenuator and variable phase-shifter are required to synthesize $\Gamma_L$ to the desired reflection coefficient. Considering $S_{12,GBU}$, it consists of a summation of the passive path $D\Gamma_L$. Equalizing the time-delay between these paths ($\Delta\tau=0$) results in a broadband constructive summation. Constructive summation minimizes the amount of required available power from the microwave amplifier for synthesizing a desired reflection coefficient $\Gamma_L$. Together with employing broadband directional couplers and broadband microwave amplifier this enables a broadband GBU response. Combination of a broadband GBU with a multi-harmonic tuner results in a system that can synthesize multiple harmonic reflection coefficients using only one loop. This minimizes the set of required components.

To ensure stability at the DUT's output reference plane, the following condition must be satisfied over the entire frequency range (FIG. 6):

$$\Gamma_{out}\Gamma_L<1 \qquad (3)$$

In order to enhance the system's robustness towards stability, the functionality of the GBU can be manipulated by proper adjustment of phase-shifter and time-delay. In this way the GBU's response, and hence $\Gamma_L$, become maximum around the tuned frequencies and reduces at the other, non-tuned, frequencies. The latter improves the stability at these non-tuned frequencies as $\Gamma_L$ reduces, see equation (3), without the use of selective filters. As example the frequency response of $\Gamma_L$ is plotted for four different combinations of $\Delta\tau$ and $\Delta\phi$ using the test bench of FIG. 7. This test bench consists of two ideal directional couplers S3P3, S3P4 (through path=1, coupled path=1, isolated path=0), a passive tuner S2 with $\Gamma_t$ fixed to −0.4, broadband variable phase-shifter PS4 and time-delay TD4 and a broadband amplifier AMP4 with G=3.3.

At the following cases the system's pass-band is assumed to be from 0.5-6 GHz and the cases are shown in FIGS. 8 to 11. The cases are:

1. $\Delta\phi=38°$, $\Delta\tau=54$ ps. Fundamental only ($f_0=2$ GHz) frequency selectivity (see FIG. 8). At $f_0=2$ GHz, $\Gamma_L$ is at its maximum and reduces below and above this frequency 2. $\Delta\phi=76°$, $\Delta\tau=54$ ps. Fundamental only ($f_0=4$ GHz) frequency selectivity (see FIG. 9). At $f_0=4$ GHz, $\Gamma_L$ is at its maximum and reduces below and above this frequency 3. Δφ=62°, Δτ=88 ps; Fundamental only ($f_o$=2 GHz) frequency selectivity with more narrow lobe with respect to FIG. 8 (see FIG. 10). This improves stability at the non-tuned frequencies.
4. Δφ=0°, Δτ=498 ps; Fundamental ($f_o$=2 GHz) and harmonic frequency selectivity at Δφ=0°, Δτ=498 ps. This allows for synthesizing multiple harmonic reflection coefficients. At f=2, 4, 6 GHz, $\Gamma_L$ is at its maximum and reduces below and above this frequencies.

The GBU is located in between the DUT and the passive tuner. The optimum setting for the passive tuner is therefore always at its maximum reflection coefficient. Therefore no advanced algorithm is required for determination of the optimum $\Gamma_t$ setting.

The calibration procedure of the proposed system is similar as the conventional on before-hand characterization procedure applied at passive tuners, in this case applied on the combination of passive tuner and GBU. This calibration remains valid whenever the amplifier is operating in its linear region. The calibration procedure is as follows: before starting characterizing the combination of the GBU and the passive tuner, the gain of the amplifier must be fixed such that at $|\Gamma_{t,max}|$ the desired $|\Gamma_{L,max}|$ results. Next, the combination can be characterized for each passive tuner setting. The obtained calibration data-set is afterwards used for tuning towards the desired reflection coefficient.

The path loss between the microwave amplifiers' output and the DUT's output is determined by the sum of the coupled path losses of directional coupler DCA and the probe and cable losses $L_A$. The larger the path loss between the microwave amplifiers' output and the DUT's output, the larger is the required available power $a_p$ of the microwave amplifier for synthesizing the desired reflection coefficient $\Gamma_L$.

Referring to FIG. 6, choosing e.g. a 5 dB directional coupler for DCA ($DC_{A,cpl}$=−5 dB) instead of a 10 dB directional coupler ($DC_{A,cpl}$=−10 dB) reduces the path loss between the microwave amplifier's output and the DUT's output with 5 dB. On the other hand, the through path loss of directional coupler DCA increases from ~0.45 dB to ~1.65 dB, which counts also double as this is in the incident and reflected path. Therefore, an optimum type of directional coupler DCA (10 dB, 5 dB, 3 dB, . . . ) exists that minimizes the required microwave amplifiers' available output power $a_p$, given the probe and cable losses $L_A$, the desired $\Gamma_L$ and the maximum available $\Gamma_t$.

The GBU can also be combined with a passive tuner at the input of a DUT for source-pulling. The setup of this hybrid source-pull system is shown in FIG. 12. This hybrid source-pull system operates equivalently with the proposed load-pull system and therefore the previous statements regarding the proposed hybrid load-pull system hold in a similar way for this source-pull system.

The GBU can be used with passive tuner and in conjunction with the open loop active injection systems. Two different configurations are shown in FIGS. 13 and 14. In FIG. 13 it is the passive tuner which creates the primary reflection at the fundamental frequency (fo) (LP tuner) and the secondary source (open-loop source) creates controlled harmonic signal injection inserted between DUT and GBU; in FIG. 14 the secondary source is inserted between GBU and passive tuner thus using the potential signal amplification of the GBU at the second or higher harmonic (2 fo, 3 fo etc.).

Although the present invention has been explained hereinabove by way of a preferred embodiment thereof, it should be pointed out that other combinations of the described components and configurations are possible and, as far as obvious to a person skilled in the art, they shall not limit or impede the scope of the present invention.

We claim:

1. A microwave hybrid (active-passive) load pull set-up for testing a device under test (DUT), comprising
   a) a cascade of active gamma boosting unit (GBU), having an input port and an output port, and
   b) a passive electro-mechanical tuner having an input port and an output port;
   whereby the DUT has an input port and an output port,
   and whereby the GBU is inserted between the output port of the DUT and the input port of the tuner;
   and whereby the GBU comprises
   two signal processing three-port blocks, one block adjacent to the DUT and one adjacent to the tuner,
   whereby the block adjacent to the DUT acts as power combiner,
   and the block adjacent to the tuner acts as power divider;
   said blocks having an input port, an output port and a coupled port;
   and whereby a sample of the signal power traversing between the input port and the output port is extracted through the coupled port,
   and whereby the path between input port and output port has low loss;
   and a cascade of a broadband microwave amplifier, said amplifier having an input port and an output port, and a broadband variable phase shifter and variable time delay,
   said cascade being inserted between the coupled ports of the blocks,
   and whereby the output port of the amplifier is connected with the coupled port of the block adjacent to the DUT;
   and whereby the output port of the tuner is terminated with a microwave load or a microwave test instrument.

2. Set-up as in claim 1, whereby the cascade comprises a broadband amplifier, phase shifter and time delay.

3. Set-up as in claim 2, whereby the phase of the phase shifter and the time delay can be adjusted independently for fundamental and harmonic frequencies.

4. Set-up as in claim 3, whereby the tuner is multi-harmonic, allowing independent control of reflection factors at harmonic frequencies.

5. Set-up as in claim 1, whereby the tuner is broadband.

6. Set-up as in claim 1, whereby a power combiner three-port, having an input port, a through port and a coupled port, is inserted between the DUT and the GBU;
   whereby the DUT is connected to the input port of said combiner;
   and whereby the GBU is connected to the through port of said combiner;
   and whereby a signal source, having adjustable signal amplitude and phase is connected to the coupled port of said combiner;
   and whereby the signal is injected into the output port of the DUT through the combiner three-port.

7. Set-up as in claim 1, whereby a power combiner three-port, having an input port, a through port and a coupled port, is inserted between the GBU and the tuner;
   whereby the GBU is connected to the input port of said combiner;
   and whereby the tuner is connected to the through port of said combiner;
   and whereby a signal source having adjustable signal amplitude and phase is connected to the coupled port of said combiner;

and whereby the signal is injected into the output port of the GBU through the combiner three-port.

8. A microwave hybrid (active-passive) source pull set-up for testing device under test (DUT), comprising a cascade of
- a) a passive electro-mechanical tuner, having an input port and an output port, and
- b) an active gamma boosting unit (GBU), having an input port and an output port;

whereby the DUT has an input port and an output port, and whereby the GBU is inserted between the output port of the tuner and the input port of the DUT;
and whereby a signal source is connected at the input port of the tuner;
and whereby the GBU comprises
a) two signal processing three-port blocks, one block adjacent to the DUT and one adjacent to the tuner, whereby the block adjacent to the DUT acts as power combiner, and the block adjacent to the tuner acts as power divider;
- said blocks having an input port, an output port and a coupled port;
- and whereby a sample of the signal power traversing between the input port and the output port is extracted through the coupled port,
- and whereby the path between input port and output port has low loss; and b) a cascade of a broadband microwave amplifier, said amplifier having an input port and an output port, and a broadband variable phase shifter and variable time delay, said cascade being inserted between the coupled ports of the blocks,
- and whereby the output port of the amplifier is connected with the coupled port of the block adjacent to the DUT.

9. Test-setup as in claim 1, whereby said blocks are directional couplers, having an input port, an output port and a coupled port,
- and low insertion loss between the input and the output port and high isolation between the coupled port and the output port.

* * * * *